US005858926A

United States Patent [19]
Schwartz et al.

[11] Patent Number: 5,858,926
[45] Date of Patent: Jan. 12, 1999

[54] PROCESS FOR PREPARING MERCURY-BARIUM-CALCIUM-COPPER-OXIDE-BASED SUPERCONDUCTOR MATERIALS

[75] Inventors: Justin Schwartz; Christian H. Wolters; Kathleen M. Amm, all of Tallahassee, Fla.

[73] Assignee: Florida State University, Tallahassee, Fla.

[21] Appl. No.: 702,733

[22] Filed: Aug. 23, 1996

[51] Int. Cl.$^6$ ................................................. H01L 39/24
[52] U.S. Cl. ..................... 505/120; 505/123; 505/125; 505/126; 505/501; 505/742; 505/783; 505/785
[58] Field of Search ................................. 505/120, 123, 505/125, 126, 501, 783, 785, 742; 427/62; 252/519.15

[56] References Cited

U.S. PATENT DOCUMENTS 5,492,885   2/1996   Hur et al. ................................. 505/120

OTHER PUBLICATIONS

Wolters et al, Physica 267, No. 1–2, pp. 164–172 Aug. 10, 1996.
Yamasaki et al, Crit. Curr. Supercond., Proc.Int. Workshop, 8th, 243–246. (1996).
Kishio et al, J. low Temp. Phys., 105(5/6), pp. 1359–1365 (1996).
E.V. Antipov, et al. "The Synthesis And Characterization Of The HgBa$_2$Ca$_2$Cu$_3$O$_{8+\delta}$ and HgBa$_2$Ca$_2$Cu$_4$O$_{10+\delta}$ Phases", *Physica C* 215 (1993) pp. 1–10.
Ronald H. Arendt, et al. "An Alternate Preparation For (Bi, Pb)$_2$Ca$_2$Sr$_2$Cu$_3$O$_z$," *Physica C* 176 (1991) pp. 126–130.
O. Chmaissem, et al. "Synthesis and Characterization of HgBa$_2$Ca$_{n-1}$Cu$_n$O$_{2n+2+\delta}$ (n=1, 2, and 3)" *Physica C* 230 (1994) pp. 231–238.
C.W. Chu, "Superconductivity at Higher Temperatures In the Hg–Ba–Ca–Cu–O Compound System" *Journal of Superconductivity*, vol. 7, No. 1, 1994, pp. 1, 5–7.
Z.H. He, et al. "High–Pressure Synthesis Of Single–Phase Superconductors Hg$_z$Sr$_x$Ba$_{2-x}$Ca$_2$Cu$_3$)$_{8+\delta}$ and (Hg, M)Sr$_2$Ca$_2$Cu$_3$O$_y$ With M=Pb And Mo", *Physica C* 241 (1995) pp. 211–218.
H. Ihara "Beyond A Half Way To Room Temperature Superconductors — ABa$_2$Ca$_{n-1}$Cu$_n$O$_{2n+3-y}$ (A=Tl, Hg, Ag, —)—" *Bulletin of The Electrotechnical Laboratory*, vol. 58, No. 6 (1994) pp. 63–68.
R.T. Kampwirth, et al. "Properties of Tl–1223 Superconducting Thick Films Fabricated From Precursor Inks Using A Thallium Vapor Transport Process", 1994 no page number.
L. Krusin–Elbaum, et al. "High Current Densities Above 100 K In The High–Temperature Superconductor HgBa$_2$CaCu$_2$O$_{6+\delta}$", *Nature*, vol. 373, Feb. 23, 1995, pp. 679–681.
R.S. Liu, et al. "A New 92 K High–T$_c$ Superconductor Hg–Containing Tl–based 1212 Phase" *Physica C* 205 (1993), pp. 206–211.

A. Maignan, et al. "The Great Ability Of Mercury–based Cuprates To Accommodate Transition Elements" *Physica C* 243 (1995) pp. 233–242.
R.L. Meng, et al. "Superconductivity at 112–117 K in HgBa$_2$CaCu$_2$O$_{6+\delta}$" *Physica C* 214 (1993) pp. 307–312.
M.S. Osofsky, et al. "Superconductivity Above 100 K in Compounds Containing Hg" *Journal of Superconductivity*, vol. 8, No. 4, 1995, pp. 511–514.
Graeme B. Peacock, et al. "Effective Synthesis of HgBa$_2$Ca$_2$Cu$_3$O$_{8+\delta}$: The Highest T$_c$ Superconductor" *Adv. Mater*, 1995, vol. 7, No. 11, pp. 925–927.
S.N. Putilin, et al. "Superconductivity Above 120 K in HgBa$_2$CaCu$_2$O$_{6+\delta}$" *Physica C* 212 (1993) pp. 266–270.
S. Reich, et al. "Variation Of The Superconducting Properties of Hg$_x$Ba$_2$Ca$_2$Cu$_3$O$_{8+\delta}$ As A Function Of the Mercury Content" *Physica C* 231 (1994) pp. 1–3.
J. Schwartz "HgBaCaCuO Superconductors: Processing, Properties And Potential" *Physica B* 216 (1995) p. 261.
Ch. Wolters, et al. "Bulk Processing of HgBaCaCuO Superconductors By A Two–Zone Technique" *IEEE Transactions on Applied Superconductivity*, vol. 5, No. 2 (1995) no page number.
Ch. Wolters, et al. "Preparation Of HgBaCaCuO Polycrystals And Silver Sheathed Tapes By A Two–Zone Technique" ICMCI Conference, 1995 no page number.

*Primary Examiner*—Roy V. King
*Attorney, Agent, or Firm*—Senniger, Powers, Leavitt & Roedel

[57] ABSTRACT

The present invention is directed to a process for preparing a HgBaCaCuO superconductor by annealing a precursor mixture comprising a lower member of the homologous HgBaCaCuO superconductor series, a source of calcium and a source of copper. The precursor mixture may further comprise a source of oxygen, a source of rhenium, and, if desired, a source of an additional element selected from the group consisting of halogens and metals other than mercury, barium, calcium, copper and rhenium. The process is particularly effective for preparing $(Hg_{1-x}Re_x)Ba_2Ca_2Cu_3O_{8-y}$ by annealing a precursor mixture containing $(Hg_{1-x}Re_x)Ba_2Ca_1Cu_2O_{6-y}$ at a temperature below about 850° C., wherein x ranges up to about 0.25 and y is a rational number ranging from about negative 1 to about positive 1.

47 Claims, 14 Drawing Sheets

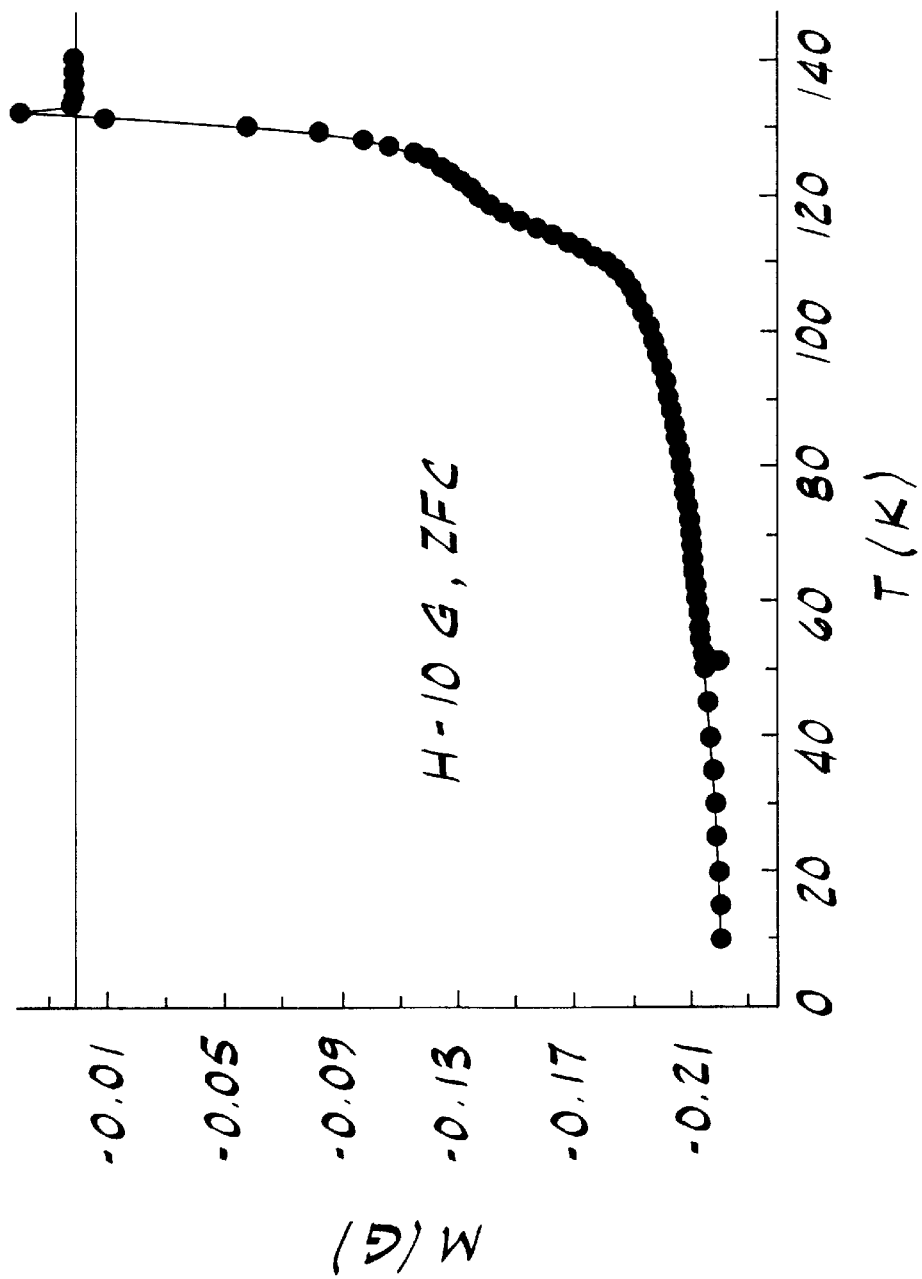

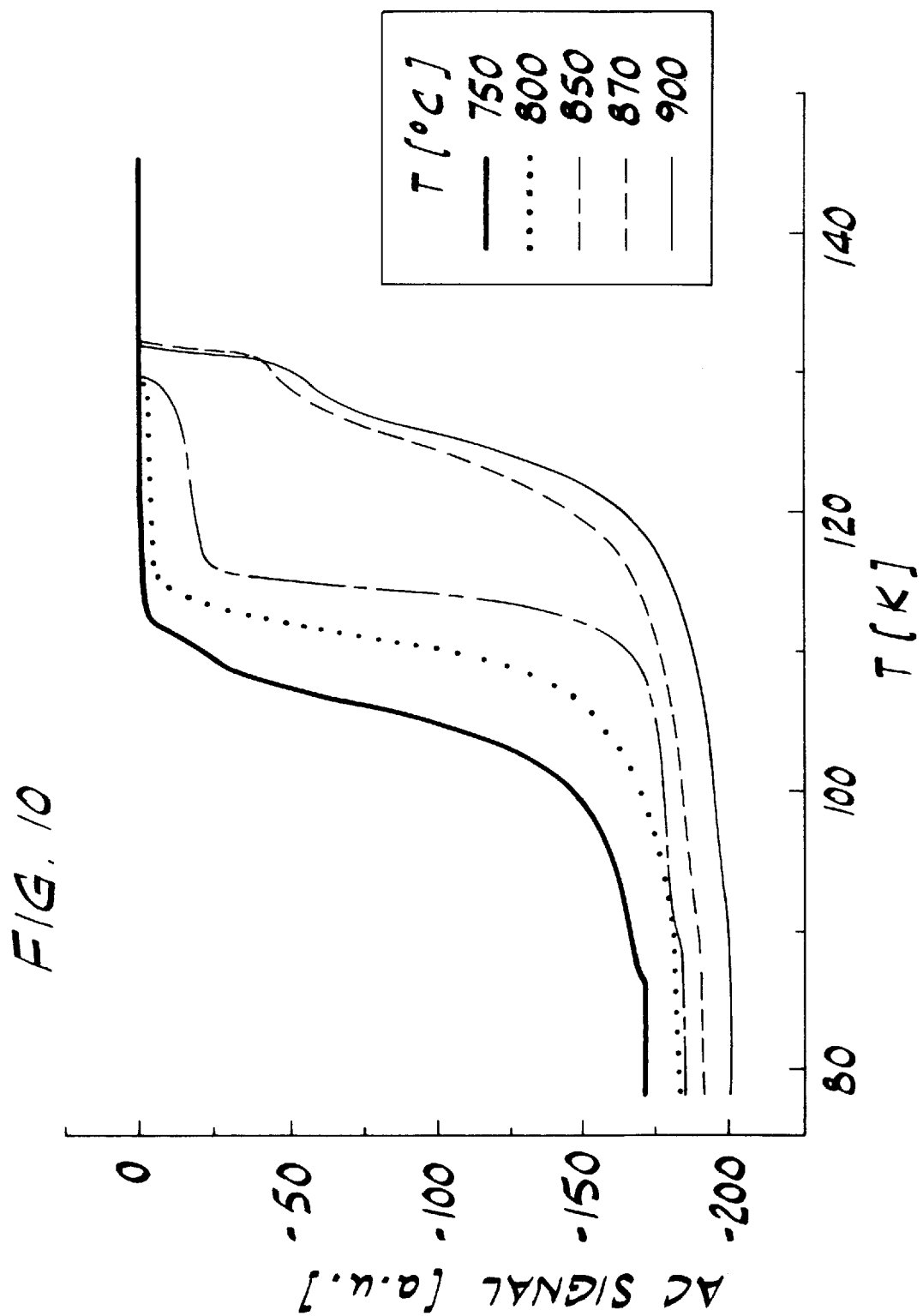

PROCESS FOR PREPARING MERCURY-BARIUM-CALCIUM-COPPER-OXIDE-BASED SUPERCONDUCTOR MATERIALS

This invention was made with Government support under National Science Foundation Grant No. DMR-9526231 awarded by the National Science Foundation. The Government has certain rights in the invention.

BACKGROUND OF THE INVENTION

In general, the present invention relates to a process for preparing a mercury-barium-calcium-copper-oxide-based superconductor material ("HgBaCaCuO superconductor" or "mercury-based superconductor"). In particular, the present invention relates to process for preparing a HgBaCaCuO superconductor from a precursor mixture containing a lower member of the homologous HgBaCaCuO superconductor series. More particularly, the invention relates to a process for preparing a $(Hg_{1-x},Re_x)Ba_2Ca_2Cu_3O_{8-y}$ superconductor material by annealing a precursor mixture comprising $(Hg_{1-x},Re_x)Ba_2Ca_1Cu_2O_{6-y}$, a source of calcium and a source of copper, wherein y is a rational number ranging between about negative 1 and postive 1, and x ranges from 0 to about 0.25.

The members of the HgBaCaCuO superconductor series have the nominal formula $HgBa_2Ca_{n-1}Cu_nO_{2n+2-y}$ wherein n is an integer greater than 0 and y is a rational number ranging between about negative 1 and positive 1. There are presently four members of the HgBaCaCuO superconductor series that have been successfully synthesized: $HgBa_2CuO_{4-y}$ ("Hg1201"), $HgBa_2CaCu_2O_{6-y}$ ("Hg1212"), $HgBa_2Ca_2Cu_3O_{8-y}$ ("Hg1223"), and $HgBa_2Ca_3Cu_4O_{10-y}$ ("Hg1234"). These HgBaCaCuO superconductors exhibit excellent superconducting properties, especially for applications above 77K, and have the highest critical temperatures ($T_c$) of all presently known superconductors. For example, Hg1201, Hg1212 and Hg1223 have critical temperatures of 94K, 128K and 135K, respectively. Hg1212 and Hg1223 have critical current densities on the order of $10^5$ A/cm$^2$ at temperatures up to 100K. At 100K they can have irreversibility fields exceeding 0.5 Tesla.

HgBaCaCuO superconductors are conventionally prepared by encapsulation, high pressure, two-zone annealing or other similar methods. See, for example, Schwartz et al., "HgBaCaCuO Superconductors: Processing, Properties and Potential," Physica B, 216 (1995) 261, which is incorporated herein by reference, which addresses some of the typical methods for preparing HgBaCaCuO superconductors. Most of these methods generally involve the preparation of a HgBaCaCuO superconductor by annealing a precursor mixture comprising oxides of mercury, barium, calcium and copper such as HgO, BaO, CaO, CuO, $Ba_2CaCu_2O$ and the like. Other methods use precursor mixtures comprising carbonates, nitrates and even elemental forms of mercury, barium, calcium and copper.

In these conventional processes for the preparation of HgBaCaCuO superconductors, factors affecting the formation of the superconducting phase include the choice and quality of precursor, annealing temperature, annealing time, mercury vapor pressure, and oxygen partial pressure. The precursor materials generally must be kept free from exposure to moisture and carbon dioxide during synthesis of the superconductor material. These synthesis requirements may be lessened by stabilizing the superconducting phase through the incorporation of the atoms of another element, or dopant, into the HgBaCaCuO superconductor structure in place of a portion of the mercury, barium, calcium or copper atoms, a process otherwise known as doping. Doping can occur by intentionally including the element in the precursor mixture used to synthesize the superconductor structure, or indirectly as a result of impurities contained in the precursor materials.

The chemical stability and physical properties of HgBaCaCuO superconductors may be manipulated by using an appropriate dopant or combination of dopants. Among the variety of available dopants, rhenium has shown beneficial effects on the formation and chemical stability of the superconducting phase without reducing the critical temperature. Other dopants such as strontium also can enhance the stability of the superconducting phase. Still other dopants such as lithium, platinum and thallium can enhance the superconducting properties of the HgBaCaCuO superconductor. In fact, Maignan et al., "The Great Ability of Mercury-Based Cuprates to Accommodate Transition Elements" Physica C, 243 (1995) 233–242, incorporated herein by reference, discloses the ability of a number of transition metals to partially replace mercury in HgBaCaCuO superconductors.

A rhenium-doped HgBaCaCuO superconductor requires a higher annealing temperature for the formation of the superconducting phase than does an undoped HgBaCaCuO superconductor. For example, conventional synthesis techniques require an annealing temperature exceeding about 850° C. to prepare a superconductor material having rhenium-doped Hg1223 as the majority phase. Annealing temperatures of less than about 850° C. have been found to be acceptable only if the material is not doped, i.e., if the material is simply Hg1223. Higher annealing temperatures increase the costs associated with the preparation of the HgBaCaCuO superconductor and can complicate the processing of the superconductor into a usable form.

One major requirement for the application of HgBaCaCuO superconductors in technical conductors (such as conductors used for power transmission applications) is the ability to produce the superconductor on a large length scale. The previously discussed preparation methods, however, generally result in superconductor samples having a limited volume. One approach that has been used to produce longer superconductor samples is to encase the HgBaCaCuO superconductor in a substrate or metal sheathing (such as platinum or nickel) and to draw, roll or swage the sheathed material into a usable form prior to annealing. Other approaches used include spray coating, tape casting and other similar methods.

High annealing temperatures and the associated high mercury and oxygen vapor pressures can complicate the preparation of metal-sheathed HgBaCaCuO superconductors. High temperatures and vapor pressures can lead to extensive corrosion and the formation of amalgams between the substrate or sheath and the HgBaCaCuO superconductor. In order to overcome the corrosion and amalgam formation problems, diffusion barriers or buffer materials between the HgBaCaCuO superconductor and the substrate or sheath often are necessary. High annealing temperatures also prevent the use of certain desired sheathing materials. For example, although silver has been successfully used for a metal sheathing for most other high critical temperature superconductors and would be desirable for HgBaCaCuO superconductors, the melting point of silver under typical process conditions is around 800° C. The exact melting point of silver will depend upon the specific mercury and oxygen vapor pressures employed in the process. The melting point, however, is lower than the annealing temperature conventionally employed to synthesize, for example, rhenium-doped Hg1223 superconductor materials. As such, silver typically cannot be used where the annealing temperature is above about 800° C.

SUMMARY OF THE INVENTION

Among the several objects and features of the present invention is the provision of a process for the synthesis of a HgBaCaCuO superconductor, particularly a process for the synthesis of rhenium-doped Hg1223; the provision of such a process which produces a desired HgBaCaCuO superconductor as the majority phase; the provision of such a process which uses a precursor mixture containing a lower member of the HgBaCaCuO superconductor series to form a higher member of the homologous HgBaCaCuO superconductor series, particularly a process for the synthesis of rhenium-doped Hg1223 from a precursor mixture containing rhenium-doped Hg1212; the provision of such a process that accelerates the formation of the superconducting phase of a HgBaCaCuO superconductor from a precursor mixture; the provision of such a process which can operate at annealing temperatures lower than about 850° C.; the provision of such a process which minimizes the energy required to convert a precursor mixture into a HgBaCaCuO superconductor; the provision of such a process in which the HgBaCaCuO superconductor is encased in, placed on or coated with a substrate or metal sheath; the provision of such a process which permits the use of substrate and sheathing materials such as silver or alloys of silver and mercury which have a low melting point relative to process annealing temperatures; the provision of such a process which eliminates or reduces the need for a diffusion barrier or buffer material between the substrate or sheathing and the HgBaCaCuO superconductor; and the provision of such a process which reduces corrosion and amalgam formation problems associated with the substrate or sheathing and the HgBaCaCuO superconductor.

Briefly, therefore, the present invention is directed to a process for preparing a HgBaCaCuO superconductor from a precursor mixture which includes a lower member of the homologous HgBaCaCuO superconductor series. In a preferred embodiment of this process, a precursor mixture containing rhenium-doped Hg1212, a source of calcium and a source of copper is annealed at a temperature below about 850° C. to form a rhenium-doped Hg1223 superconductor. The rhenium-doped Hg1212 used in the precursor mixture is produced in a separate step from commercially available precursors. In another embodiment of the invention, a second dopant selected from the group consisting of halogens and metals other than mercury, barium, calcium, copper and rhenium is additionally incorporated in the superconducting material.

Other objects and features of the present invention will be in part apparent and in part pointed out hereinafter.

BRIEF DESCRIPTION OF THE DRAWINGS

FIG. 9 illustrates the SQUID magnetization measurement of $(Hg_{1-x}Re_x)Ba_2Ca_2Cu_3O_{8-y}$ prepared in the conventional encapsulation manner using an annealing temperature of 880° C. for 8 hours.

FIG. 10 illustrates the AC susceptibility of $(Hg_{1-x}Re_x)Ba_2Ca_2Cu_3O_{8-y}$ prepared in the conventional encapsulation manner as a function of annealing temperature.

DETAILED DESCRIPTION OF THE PREFERRED EMBODIMENTS

Figure 1:
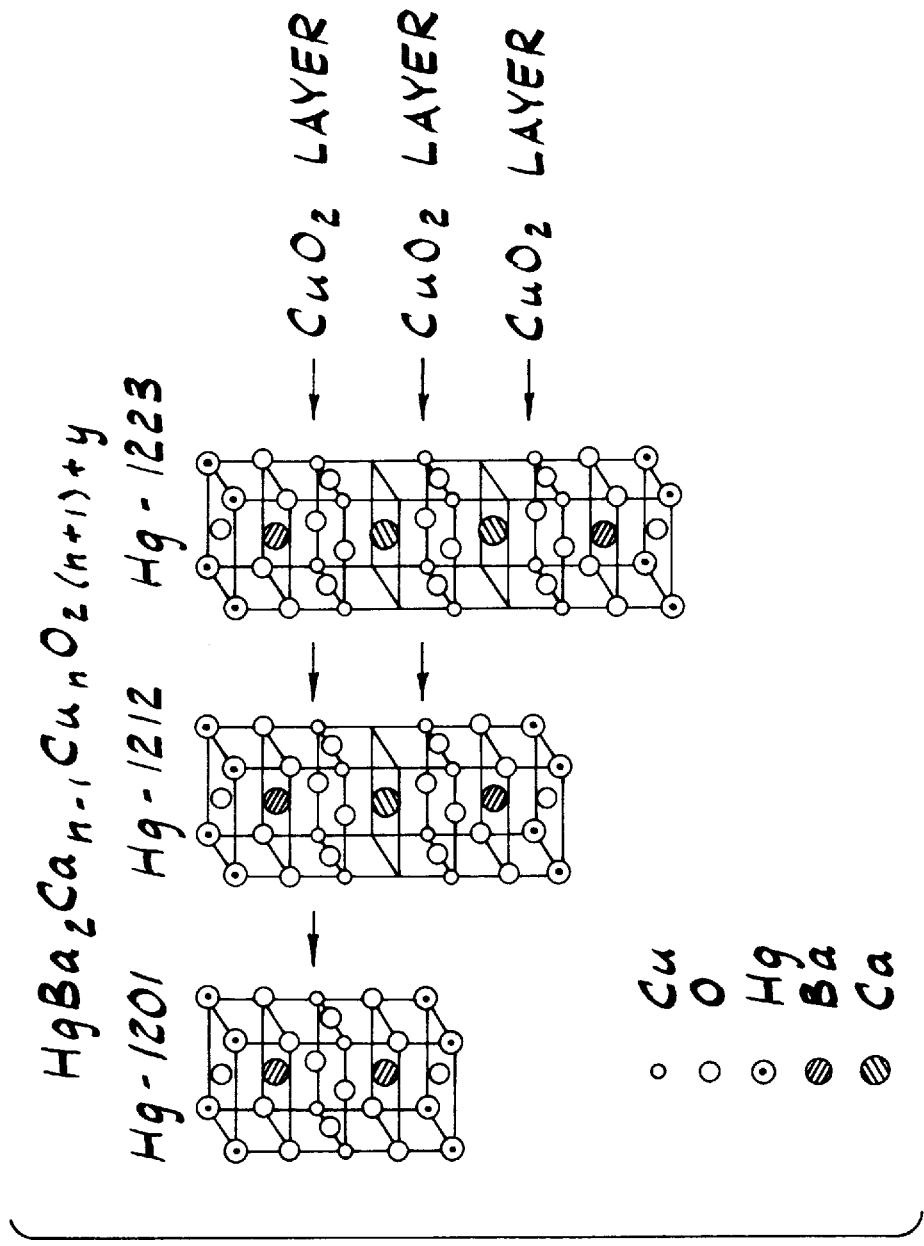
FIG. 1 schematically represents the structure of the first three members of the HgBaCaCuO superconductor series.
Figure 2:
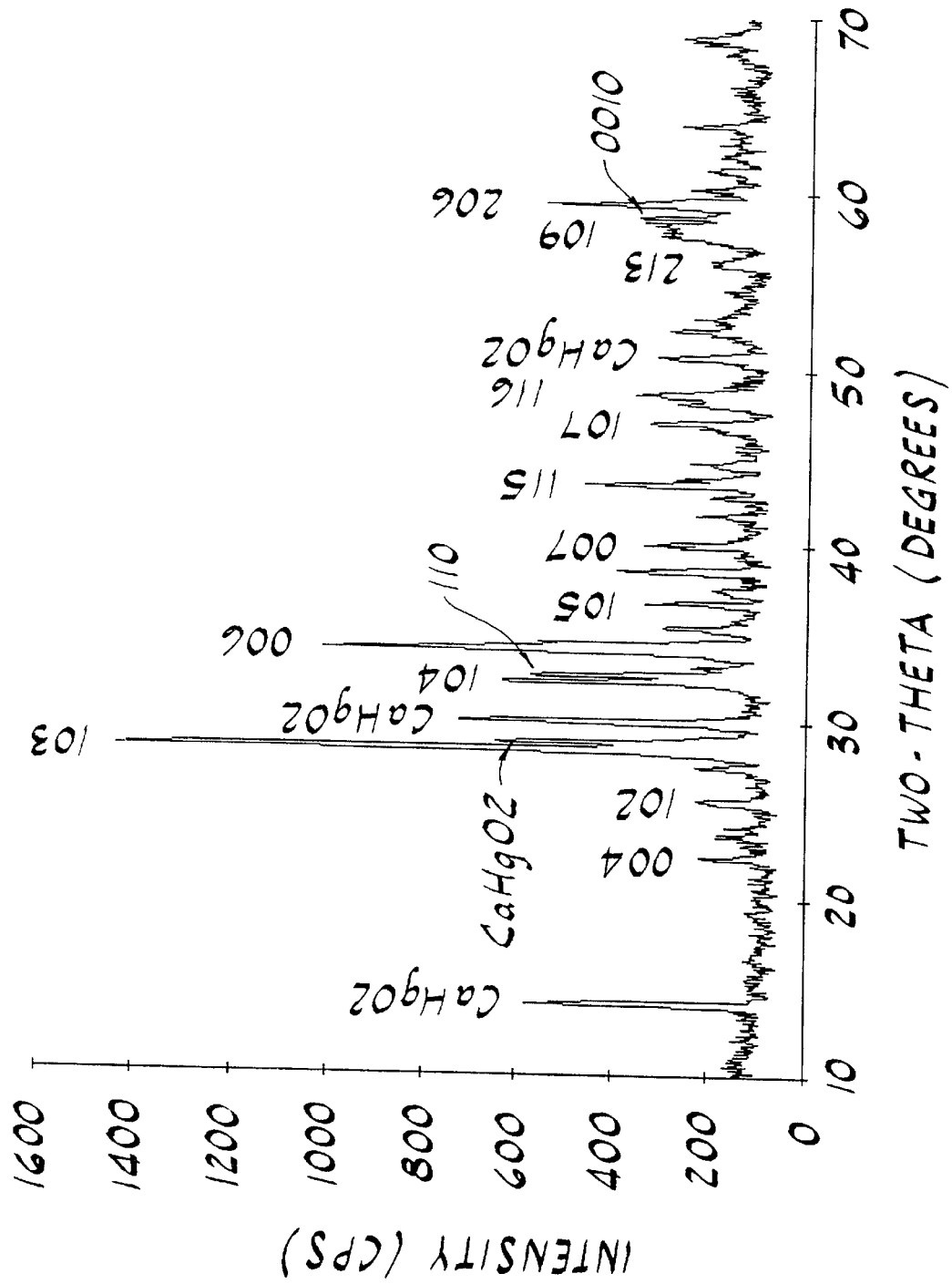
FIG. 2 displays the Energy Dispersive X-ray Spectroscopy results for a $(Hg_{1-x}Re_x)Ba_2Ca_2Cu_3O_{8-y}$ sample prepared in accordance with the process and annealed at 850° C. for 8 hours.
Figure 3:
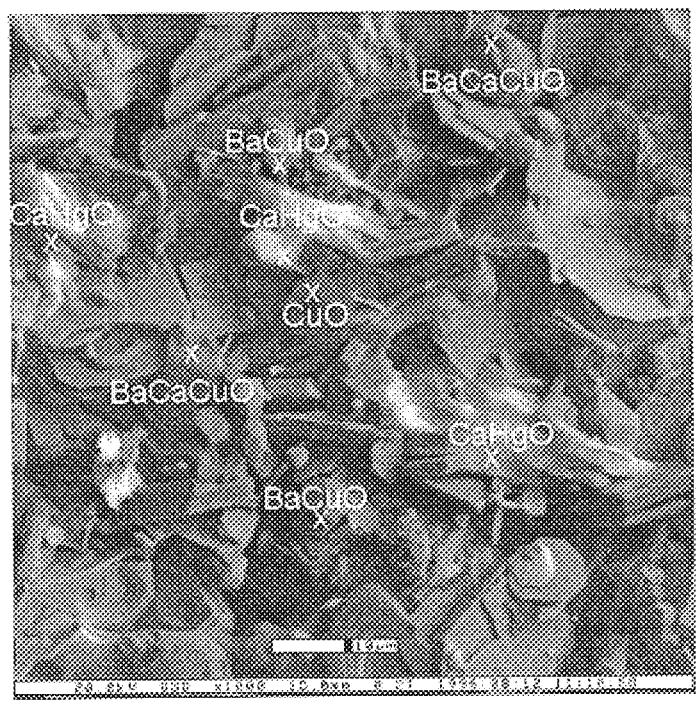
FIG. 3 shows the SEM surface images of the superconducting phase and the secondary phases for the same $(Hg_{1-x}Re_x)Ba_2Ca_2Cu_3O_{8-y}$ sample reported in FIG. 2.
Figure 4A:
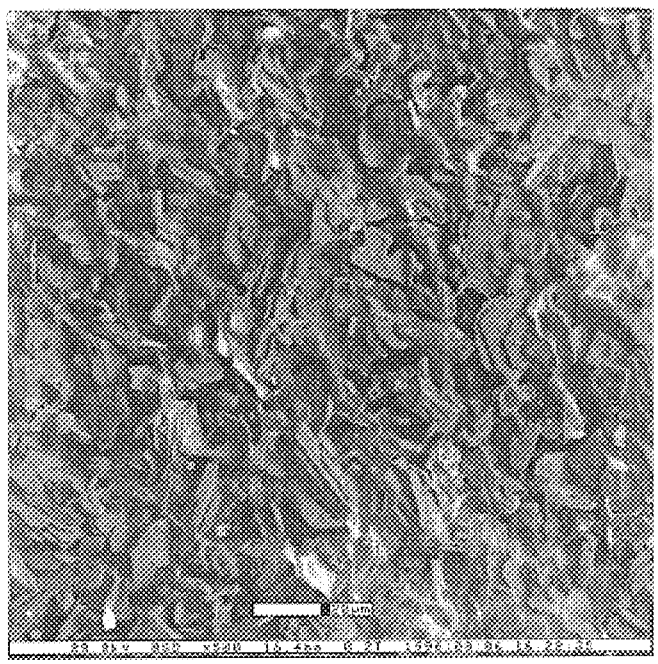
FIG. 4 shows the SEM surface images of $(Hg_{1-x}Re_x)Ba_2Ca_2Cu_3O_{8-y}$ samples prepared in accordance with the process using the following annealing times and temperatures: (a) 8 hours at 850° C.; (b) 48 hours at 850° C.; (c) 8 hours at 800° C.; (d) 48 hours at 800° C.; (e) 8 hours at 750° C.; and (f) 48 hours at 750° C.
Figure 4B:
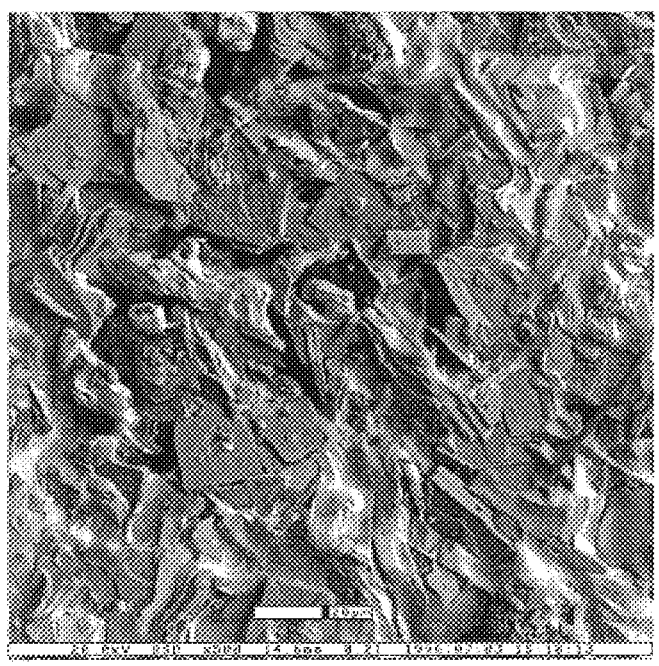
Figure 4C:
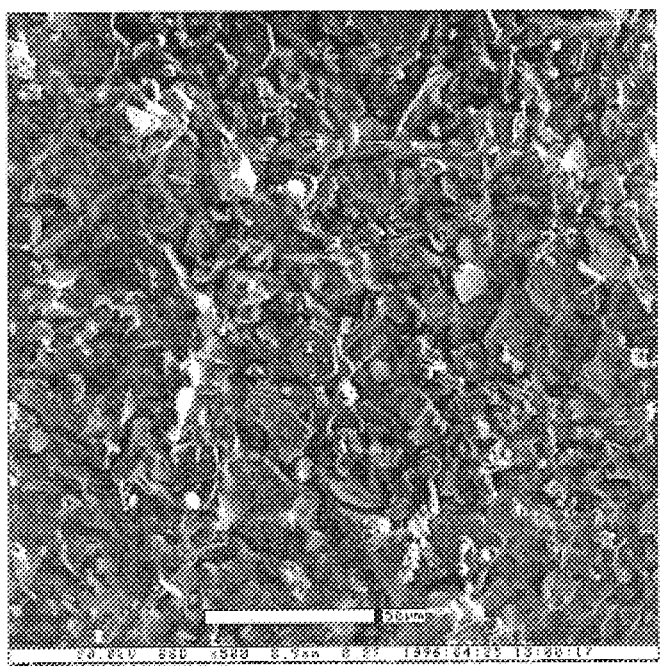
Figure 4D:
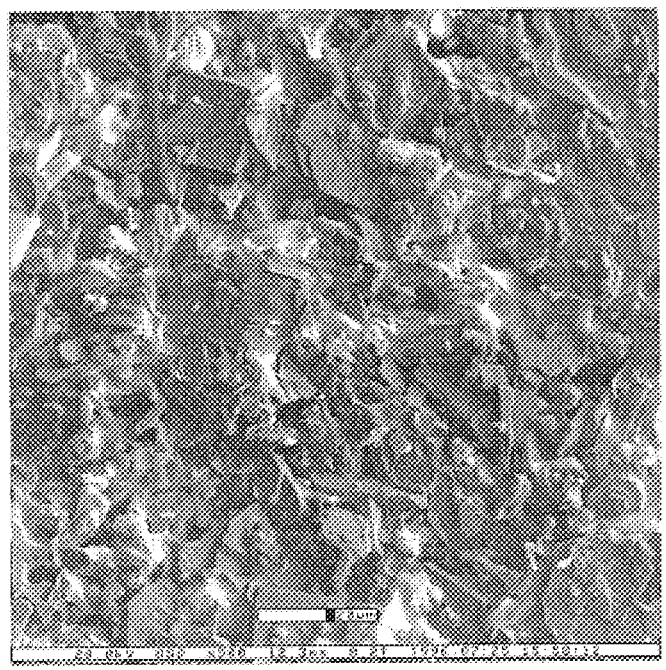
Figure 4E:
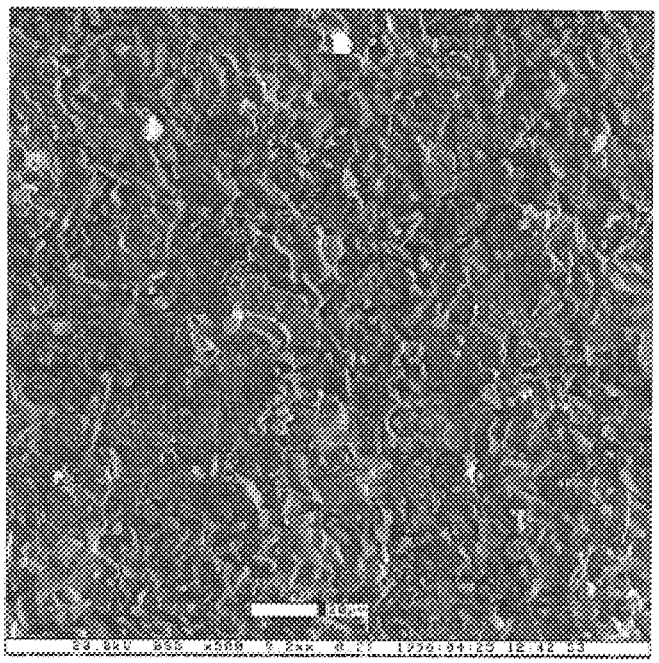
Figure 4F:
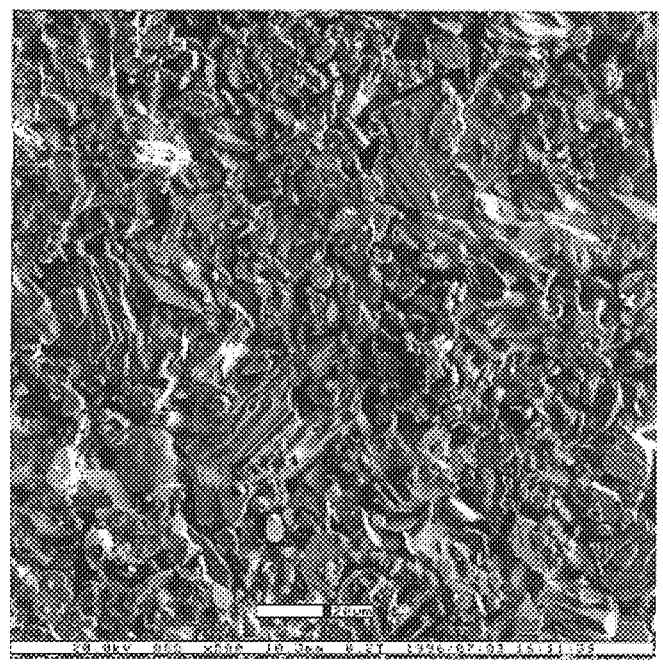

The present invention relates to a process for the preparation of a HgBaCaCuO superconductor. The HgBaCaCuO superconductor comprises mercury, barium, calcium, copper and oxygen and is synthesized by annealing a precursor mixture which comprises a lower member of the homologous HgBaCaCuO superconductor series, a source of calcium and a source of copper. For example, Hg1212 can be synthesized from a precursor mixture containing Hg 1201, Hg1223 can be synthesized from a precursor mixture containing Hg 1212, and Hg1234 can be synthesized from a precursor mixture containing Hg 1223. FIG. 1 shows the structure of the first three members of the HgBaCaCuO superconductor series. The HgBaCaCuO superconductor preferably has the formula $HgBa_2Ca_{n-1}Cu_nO_{2n+2-y}$ wherein n is an integer greater than 0 and y is a rational number between about negative 1 and positive 1.

In addition, the precursor mixture used to synthesize the HgBaCaCuO superconductor may further comprise a source of oxygen to supplement the oxygen already contained in the lower member present in the precursor mixture. If this additional source of oxygen is not present in the precursor mixture, the formation of the HgBaCaCuO superconductor will still occur. The superconductor, however, may require additional annealing in an oxygen environment to optimize its superconducting properties. The precursor mixture may further comprise a source of mercury and a source of barium, although the lower member of the homologous HgBaCaCuO series typically contains the stoichiometrically required amount of these elements for the precursor mixture. The HgBaCaCuO superconductor preferably is doped with rhenium and, if desired, may additionally include a second dopant selected from the group consisting of halogens and metals other than mercury, barium, calcium, copper and rhenium. Although the invention is not so restricted, it is particularly effective for synthesizing rhenium-doped $HgBa_2Ca_2Cu_3O_{8-y}$ by annealing a precursor mixture comprising rhenium-doped $HgBa_2Ca_1Cu_2O_{6-y}$, a source of calcium and a source of copper.

An objective of the present invention is to provide a process for producing HgBaCaCuO superconductors without significantly reducing the high critical temperature and high current density found in HgBaCaCuO superconductors produced by other processes, particularly for rhenium-doped HgBaCaCuO superconductors. Another objective is to reduce the annealing time and/or annealing temperature required to prepare such HgBaCaCuO superconductors. Although annealing may successfully occur at temperatures from about 850° C. to about 950° C. using the process, the process also can be practiced by annealing the precursor mixture at temperatures in the range of about 750° C. to about 850° C. In particular, the invention is directed to a process for producing rhenium-doped $HgBa_2Ca_2Cu_3O_{8-y}$ at temperatures below about 850° C. Lower annealing time and temperature requirements can result in significant cost savings. Yet another objective is to provide such a process which produces a HgBaCaCuO superconductor as the majority phase, particularly at temperatures below about 850° C.

In a preferred embodiment of the invention, the HgBaCaCuO superconductor is doped with rhenium, the atomic ratio of mercury to rhenium in the precursor mixture and the superconductor structure is greater than about 3:1, the atomic ratio of mercury plus rhenium to barium to calcium to copper in the superconductor structure is approximately 1:2:2:3, and the superconductor is prepared by annealing a precursor mixture comprising rhenium-doped Hg1212, a source of calcium and a source of copper. The substitution of rhenium for a portion of the mercury chemically stabilizes and enhances formation of the (Hg,Re)1223 phase. Preferably the rhenium-doped Hg1223 has the formula $(Hg_{1-x}, Re_x)Ba_2Ca_2Cu_3O_{8-y}$ ("(Hg,Re)1223") and the rhenium-doped lower member of the homologous HgBaCaCuO superconductor series has the formula $(Hg_{1-x},Re_x)Ba_2Ca_1Cu_2O_{6-y}$ ("(Hg,Re)1212"), wherein x is the fraction of mercury atoms substituted with rhenium atoms in the HgBaCaCuO superconductor structure and ranges from about 0 to about 0.25, preferably, from about 0.05 to about 0.20, and more preferably, from about 0.05 to about 0.15. The term y is a rational number ranging between about negative 1 and about positive 1. In this embodiment, the HgBaCaCuO superconductor prepared can, if desired, be undoped, i.e., the precursor mixture comprises the undoped lower member (for example, Hg1212), a source of calcium and a source of copper.

The source of calcium and the source of copper encompass all sources of these elements, including any source of calcium and copper in combination with oxygen. For example, the calcium and copper used in the the process can be elemental calcium and/or copper (e.g., either vaporized or sputtered onto the other components of the precursor mixture), oxides of these elements such as CaO, CuO, $Ca_2CuO_3$ or $Ca_2Cu_2O_4$, or any other source of calcium or copper so long as the approximate stoichiometry for the process is maintained.

The source of oxygen, if additionally included in the precursor mixture to supplement the oxygen already contained in the lower member, encompasses any source of oxygen, including a source of oxygen in combination with mercury, barium, calcium or copper. For example, the oxygen used in the process may be in the form of gaseous oxygen, an oxide of mercury, barium, calcium or copper, or any other source of oxygen so long as the approximate stoichiometry for the process is maintained.

The source of mercury used in the precursor mixture encompasses any source of mercury, including a source of mercury in combination with oxygen. For example, the mercury used in the process may be in the form of mercury vapor (as in a HgBaCaCuO superconductor prepared using the two-zone method) or liquid mercury, an oxide of mercury such as HgO, or any other source of mercury so long as the approximate stoichometry for the process is maintained.

Either crystalline or amorphous oxides may be used without materially affecting the process. Suitable sources of calcium, copper, oxygen, mercury and barium for use in the precursor mixture are commercially available. For example, 99.999% purity HgO, 99.9999% purity CaO and 99.99999% purity CuO are readily available from ESPI. The precursor mixture may additionally contain a varying amount of commercially available oxide mixes consisting of CaO, CuO, BaO, $Ca_2Cu_2O_4$, BaCuO, $Ba_2CuO$ and other such oxides. (Hg,Re)1212 currently is not commercially available yet and must be synthesized for use in the process as discussed below.

The source of rhenium encompasses any source of this element, including any source of rhenium in combination with oxygen. For example, the rhenium used in the process can be in the form of elemental rhenium, an oxide of rhenium such as $Re_2O_7$, or any other source of rhenium so long as the approximate stoichiometry for the process is maintained. $Re_2O_7$ is available from Alpha Aesar (99.9% purity).

Preferably, (Hg,Re)1223 is prepared from a precursor mixture comprising (Hg,Re)1212, a source of calcium and a source of copper. The general overall stoichiometry of the process for preparing (Hg,Re)1223 can be represented several ways including the following:

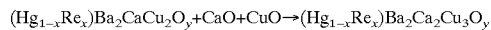

$(Hg_{1-x}Re_x)Ba_2CaCu_2O_y+CaO+CuO\rightarrow(Hg_{1-x}Re_x)Ba_2Ca_2Cu_3O_y$ or

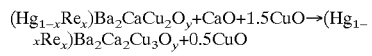

$(Hg_{1-x}Re_x)Ba_2CaCu_2O_y+CaO+1.5CuO\rightarrow(Hg_{1-x}Re_x)Ba_2Ca_2Cu_3O_y+0.5CuO$ The precursor mixture components preferably are provided in amounts which are within 1% to 2% of the theoretical stoichiometric amounts necessary for the preparation of (Hg,Re)1223. Precise stoichiometric amounts, however, are not necessarily required as samples of (Hg,Re)1223 have been synthesized in accordance with the present invention wherein, for example, CuO was provided in an amount 20 atomic percent to 50 atomic percent greater than that which is required by the stoichiometry of the process. As discussed above, sources of calcium and copper other than CaO and CuO can also be used after allowing for the appropriate stoichiometric adjustments.

The precursor mixture is mixed well in powder form and pressed into pellets which are placed into an alumina tube. Preferably, the size of the particles of the unpressed precursor mixture ranges from about 1 μm to about 150 μm, with an average particle size which is less than about 100 μm after mixing. More preferably, the average particle size is less than about 30 μm, and most preferably, less than about 10 μm.

In addition, the pressed precursor mixture need not be pellet-shaped. Any shape convenient for annealing may be used. In fact, different applications of the superconductor material may require different shapes for the resulting material. The precursor mixture is pressed to increase its density and the proximity of the individuals atoms to one another. In this embodiment of the invention, it is the density of the precursor mixture prior to annealing that should be controlled rather than the specific shape of the mixture or the method of pressing or otherwise increasing the density of the mixture. Preferably, the average density of the pressed precursor mixture prior to annealing is greater than about 1.4 times the average density of the unpressed precursor mixture. More preferably, it is about 2.5 times the average density of the unpressed precursor mixture.

Other embodiments of the invention, however, do not require that the precursor mixture be pressed prior to annealing. For example, superconductor materials prepared by the two-powder method or in accordance with the procedure set forth in Example 5 herein do not require pressing of the precursor mixture. In addition, the mixing of the precursor mixture may involve the mixing of solid, liquid and/or gaseous phases as in the two zone method where mercury is separately vaporized and diffuses to the precursor mixture.

The alumina tube containing the precursor mixture is placed into a quartz tube which is then evacuated and sealed. The pellets in the quartz tube are annealed at a temperature from about 750° C. to about 850° C. for about 8 hours to about 48 hours, although annealing times up to about 100 hours generally are still effective. Preferably, the pellets are annealed at a temperature of less than about 775° C. for less than about 48 hours; more preferably, the pellets are annealed at a temperature of less than about 800° C. for less than about 32 hours; still more preferably, the pellets are annealed at a temperature of less than about 825° C. for less than about 24 hours; and most preferably, the pellets are annealed at a temperature of less than about 850° C. for less than about 16 hours.

Because superconducting phase formation and composition vary with the annealing temperature, a HgBaCaCuO superconductor annealed at a lower temperature generally requires a longer annealing time relative to a HgBaCaCuO superconductor annealed at a higher temperature in order to produce a HgBaCaCuO superconductor of similar composition. At an annealing temperature of about 750° C., (Hg,Re)1212 and (Hg,Re)1223 are found in approximately equal amounts, surrounded by various second phases. With increased annealing temperature the grain sizes increase and larger amounts of oxides of mercury and calcium, either individually or in combination, appear in the microstructure. At an annealing temperature of about 850° C., the superconducting (Hg,Re)1223 grains are found in clusters of aligned plates having diameters up to about 30 $\mu$m and thicknesses up to about 10 $\mu$m, together with clusters of oxides of mercury and calcium, either individually or in combination, which are of about equal size. With longer annealing time at higher temperatures, the amount of these oxides increases.

The resulting samples prepared in accordance with this embodiment of the process have (Hg,Re)1223 as the majority phase. They commonly contain at least about 50% to 70%, and may contain up to about 90% to about 100%, (Hg,Re)1223 by weight. Analysis of the samples confirms critical temperatures of about 133K. The platelike superconducting grains are typically between about 5 $\mu$m and about 20 $\mu$m in diameter and about 1 $\mu$m to about 3 $\mu$m thick. The phase purity and grain size increase as annealing time increases. After annealing for 48 hours, the samples contain less than 30% by weight of second phases which consist primarily of unreacted $Ba_2CaCu_2O_5$ and oxides of mercury and calcium, either individually or in combination. Some amount of a second phase or impurity from the precursor mixture can be, but is not always, desirable to enhance material strength and other physical properties of the HgBaCaCuO superconductor. The presence of a second phase also can, but does not always, enhance superconducting properties.

The method of synthesis of the (Hg,Re)1212 is not critical to the process. Any source of (Hg,Re)1212 meeting the requirements of the process suffices. For example, (Hg,Re)1212 produced by the encapsulation technique, high pressure technique or two-zone technique is suitable for the process. The (Hg,Re)1212 precursor mixture, however, contains at least about 50% (Hg,Re)1212 by weight, preferably, at least about 60%, more preferably, at least about 70%, and most preferably, at least about 80%.

(Hg,Re)1212 can be prepared, for example, from commercially available multiphase $Ba_2Ca_1Cu_2O_5$ precursors, a source of mercury and a source of rhenium by the encapsulation technique. Suitable commercial multiphase $Ba_2Ca_1Cu_2O_5$ precursors can be obtained from Seattle Specialty Ceramics (99.9%, 1000 ppm C, 3 $\mu$m particle size) and Superconductive Components, Inc. (99.9%, 250 ppm C, 1 $\mu$m particle size). These multiphase precursors consist of a broad mix of compounds with the overall mixture having a nominal composition of $Ba_2Ca_1Cu_2O_5$. Suitable sources of mercury and rhenium are available as previously discussed above. Preferably, the multiphase precursor powders, the source of mercury and the source of rhenium are provided in amounts which are within 1% to 2% of the theoretical stoichiometric amounts necessary for the preparation of (Hg,Re)1212. Precise stoichiometric amounts, however, are not required to obtain a sample having a $(Hg_{1-x},Re_x)Ba_2Ca_1Cu_2O_{6-y}$ composition which is suitable for use in the process. The term x has the same definitions as previously discussed and ranges from 0 up to about 0.25. The term y is a rational number ranging from about negative 1 to positive 1.

This precursor mixture is mixed well in powder form and pressed into pellets which are placed into an alumina tube. The preferred particle size, particle distribution and density of the (Hg,Re)1212 precursor mixture are similar to the preferred particle size, particle distribution and density discussed above with respect to the (Hg,Re)1223 precursor mixture. The alumina tube is placed into a quartz tube which is then evacuated and sealed. The pellets in the quartz tube are heated to about 800° C. to about 850° C. over 6 hours and annealed at a temperature of about 800° C. to about 850° C. for about 8 hours to about 48 hours before cooling to room temperature over about 6 hours.

The (Hg,Re)1212 prepared in this manner exhibits a critical temperature of 112K. Grain size and phase purity increase with the annealing time. The domains of platelike grains are randomly oriented and are as large as about 50 $\mu$m after about 48 hours of annealing. Second phases identified are unreacted precursor and oxides of calcium and mercury, either individually or in combination, which are found in varying amounts. Grinding of the (Hg,Re)1212 pellets in an agar mortar for use in the preparation of (Hg,Re)1223 results in a powder with typical particle sizes between about 2 $\mu$m and about 10 $\mu$m. A few larger crystals having a particle size up to about 20 $\mu$m can also be detected. After adding CuO and CaO and further grinding, a mostly homogeneous precursor mixture results.

This process for preparing (Hg,Re)1212 is intended to be exemplary only and is not intended to exclude other possible sources of (Hg,Re)1212. (Hg,Re)1212 may also be produced by other variations of the encapsulation technique employed above or in accordance with other techniques such as the high pressure and two-zone annealing techniques. Although (Hg,Re)1212 is not currently commercially available yet, a commercially available (Hg,Re)1212 meeting the requirements of the process also would be acceptable.

Likewise, the above-discussed overall process for preparing (Hg,Re)1223 is intended to be exemplary only. (Hg,Re)1223 may also be produced by other variations of the encapsulation technique employed above or by appropriate variations of high pressure, two-zone annealing and other conventional techniques. Similarly, the process for preparing (Hg,Re)1223 is exemplary of the process for preparing other members of the HgBaCaCuO superconductor series, such as the process for preparing Hg1212 or (Hg,Re)1212 from a precursor mixture containing Hg1201 or $(Hg_{1-x},Re_x)Ba_2Ca_1Cu_2O_{2n+2-y}$ ("(Hg,Re)1201"), respectively, and other stoichiometrically appropriate precursors.

For the microstructural analysis discussed above and in the examples discussed later, all samples were mounted in epoxy (Buehler Epoxide), ground with sandpaper from 500 to 4000 grit using ethanol as a lubricant, and polished with oil-based diamond solutions of 9 $\mu$m, 3 $\mu$m, and an $Al_2O_3$ dispersion of 0.05 $\mu$m. Electron microscopy studies were performed on polished and untreated samples. Phase compositions were analyzed with Energy Dispersive X-ray Spectroscopy (EDX) and X-ray diffractometry. For $\theta$-2$\theta$ X-ray diffractometry, samples were measured with Cu—$K_\alpha$ radiation between 20° and 70°. Superconducting properties were investigated by a SQUID magnetometer (Quantum Design) and by AC susceptibility measurements.

In another embodiment of the invention, the process is used to prepare a rhenium-doped, Hg1223 superconductor which contains in addition to rhenium another element, or dopant, selected from the group consisting of halogens and metals other than mercury, barium, calcium, copper and rhenium. Preferably, the additional element is selected from the group consisting of lithium, strontium, thallium, vanadium, chromium, tungsten, platinum, gold and silver, and most preferably, the element is selected from the group consisting of lithium, strontium and thallium. In addition, the superconductor preferably has the formula $(Hg_{1-(x+z)}, Re_x, D_z)Ba_2Ca_2Cu_3O_{8-y}$ wherein the terms x and y are as previously defined and D is the additional element. The term z is the fraction of mercury atoms replaced by atoms of the additional element in the structure of the superconductor and ranges from about 0 to about 0.25, preferably, from about 0.05 to about 0.20, and more preferably, from about 0.05 to about 0.15.

The second dopant further refines the properties of the superconductor material or further promotes or stabilizes the formation of the superconducting phase when selected from the group consisting of halogens and metals other than mercury, barium, calcium, copper and rhenium. In this embodiment of the invention, $(Hg_{1-(x+z)}, Re_x, D_z)Ba_2Ca_2Cu_3O_{8-y}$ is prepared as discussed above except for the addition of the second dopant. A source of the second dopant is separately added to the precursor mixture prior to annealing or, alternatively, the dopant is incorporated into the Hg1212 superconductor used in the precursor mixture. In a further variation of this embodiment, the second dopant replaces a portion of the barium, calcium or copper in the structure of a HgBaCaCuO superconductor rather than replacing a portion of the mercury. An example of this embodiment is the partial replacement of barium with strontium to prepare a HgBaCaCuO superconductor having the formula $(Hg_{1-x},Re_x)(Ba_{1-z},Sr_z)_2Ca_2Cu_3O_{8-y}$ wherein the terms x, y and z are as previously defined.

In yet another embodiment of the invention, a rhenium-doped HgBaCaCuO superconductor is prepared from a precursor mixture containing (1) a HgBaCaCuO superconductor which is a lower member of the homologous HgBaCaCuO superconductor series, (2) a source of calcium, and (3) a source of copper. The precursor mixture additionally may comprise a source of oxygen, a source of barium, a source of mercury, a source of rhenium and, if desired, a source a another element selected from the group consisting of halogens and metals other than mercury, barium, calcium, copper and rhenium. The rhenium and the additional element may be incorporated independently into the lower member of the HgBaCaCuO superconductor series used in the precursor mixture or, alternatively, a source of each element may be added separately to the precursor mixture. The components of the precursor mixture are provided in an amount which approximates the stoichiometry of the HgBaCaCuO superconductor material synthesized. Preferably, the amount by weight of the lower member of the HgBaCaCuO superconductor series is at least about 50%. In this embodiment of the invention, the higher member of the HgBaCaCuO superconductor series is prepared from a precursor mixture including the lower member of the HgBaCaCuO superconductor series in the same manner as the prior embodiments after allowing for the required adjustments to the stoichiometries. For example, (Hg,Re)1212 can be prepared from a precursor mixture containing (Hg,Re)1201, and (Hg,Re)1234 can be prepared from a precursor mixture containing (Hg,Re)1223.

Superconductor materials prepared in accordance with the present invention can be processed as described above into wires, tapes, films or any other form for use in technical conductors. Such processing can be effected using such techniques as the thick film ink process, the spray pyrolysis film preparation process and other preparation techniques.

EXAMPLE 1

Preparation of (Hg,Re)1212

2.465 grams of $Ba_2CaCu_2$ (SSC Inc., 99.9% purity), 0.921 gram of HgO (ESPI, 99.999% purity), and 0.114 gram of $Re_2O_7$ (Alpha Aesar) were mixed until the powder mixture was consistent throughout. It was then mixed for an additional 10 minutes to ensure homogeneity. The powder mixture was pressed into two pellets using a hardened steel press having a 15.0 mm I.D. and 25.0 mm O.D. cylinder and a 14.6 mm O.D. piston. Approximately 1.5 grams of the powder mixture was pressed each time to a pressure of 5000 psi using a hand pumped Carver Laboratory Press.

The pellets formed by the press were in the shape of a disk and had a thickness of about 2.0 mm and a diameter of about 15 mm. The disks were sliced into approximately 5 mm by 5 mm pellets. The pellets were then placed into two 50.0 mm long alumina sheaths (6.0 mm I.D., 7.0 mm O.D.) with each sheath containing about 1.5 grams of the pellets. The sheaths were placed into a quartz tube (8.0 mm I.D., 12.0 mm O.D.) having one end closed. The two alumina sheaths were followed by a solid 50.0 mm long quartz rod (7.0 mm O.D.). The quartz rod was used to reduce the open volume and keep the heat of the torch away from the sample during the following encapsulation. All handling of the precursor materials such as mixing, grinding, and pressing was performed in a controlled atmosphere (argon) glovebox maintaining moisture levels below 500 ppm using a circulation air pump and absorbent filter system. To minimize exposure to air, precursors and samples were transferred to and from the glovebox in sealed containers.

The quartz tube was then sealed at the open end with tape and removed from the glove box. The tape was removed from the open end of the tube and the tube was tightly fit into a vacuum hose. The tube was then evacuated to approximately 150 millitorr using a HyVac 7 vacuum pump. Once the tube was evacuated with the sample in it, it was sealed using a hydrogen/oxygen torch. The encapsulated sample was then annealed in a box furnace. The sample was heated to 800° C. in 6 hours and held at 800° C. for 48 hours. It was then brought down to room temperature over 6 hours. The sample was taken out of the evacuated quartz tube, placed into a sample bottle, and stored in a dessicator.

Upon analysis, it was determined that the sample contained about 90% (Hg,Re)1212 by weight and had a critical temperature of about 115K.

EXAMPLE 2

Preparation of (Hg,Re)1223

1.211 grams of the (Hg,Re)1212 prepared in Example 1 were crushed into a fine powder using an agar mortar and agar pestle. The (Hg,Re)1212 powder, 0.067 gram HgO (ESPI, 99.999% purity), 0.092 gram CaO (ESPI, 99.9999% purity and 0.130 gram CuO (ESPI, 99.99999% purity) were mixed until the powder mixture was consistent throughout. It was then mixed for an additional 10 minutes to ensure homogeneity. The powder mixture was pressed into a pellet using a hardened steel press having a 15.0 mm I.D. and 25.0 mm O.D. cylinder and a 14.6 mm O.D. piston. Approximately 1.5 grams of the powder mixture were pressed to a pressure of 5000 psi using a hand pumped Carver Laboratory Press.

The pellet formed by the press was in the shape of a disk and had a thickness of about 2.0 mm to about 2.5 mm and a diameter of about 15 mm. The disk was sliced into approximately 5 mm by 5 mm pellets. The pellets were then placed into a 50.0 mm long alumina sheath (6.0 mm I.D., 7.0 mm O.D.) with the sheath containing about 1.0 gram of the pellets. The sheath was placed into a quartz tube (8.0 mm I.D., 12.0 mm O.D.) having one end closed. The alumina sheath was followed by a solid 50.0 mm long quartz rod (7.0 mm O.D.). The quartz rod was used to reduce the open volume and keep the heat of the torch away from the sample during the following encapsulation. All handling of the precursor materials such as mixing, grinding, and pressing was performed in a controlled atmosphere (argon) glovebox maintaining moisture levels below 500 ppm using a circulation air pump and absorbent filter system. To minimize exposure to air, precursors and samples were transferred to and from the glovebox in sealed containers.

The quartz tube was then sealed at the open end with tape and removed from the glove box. The tape was removed from the open end of the tube and the tube was tightly fit into a vacuum hose. The tube was then evacuated to approximately 150 millitorr using a HyVac 7 vacuum pump. Once the tube was evacuated with the sample in it, it was sealed using a hydrogen/oxygen torch. The encapsulated sample was then annealed in a box furnace. The sample was heated to 800° C. in 6 hours and held at 800° C. for 8 hours. It was then brought down to room temperature over 6 hours. The sample was taken out of the evacuated quartz tube, placed into a sample bottle, and stored in a dessicator.

Upon analysis, it was determined that the sample contained about 75% (Hg,Re)1223 by weight and had a critical temperature of about 132K.

EXAMPLE 3

Preparation of (Hg,Re)1223

1.211 grams of the (Hg,Re)1212 prepared in Example 1 were crushed into a fine powder using an agar mortar and agar pestle. The (Hg,Re)1212 powder, 0.067 gram HgO (ESPI, 99.999% purity) and 0.222 gram $Ca_2Cu_2O_4$ (ANL, 99% purity) were mixed using an agar mortar and agar pestle until the powder mixture was consistent throughout. It was then mixed for an additional 10 minutes to ensure homogeneity. Otherwise, the powder mixture was processed according to the procedure outlined in Example 2. Upon analysis, it was determined that the resulting sample contained about 70% (Hg,Re)1223 by weight.

EXAMPLE 4

Performance Evaluation of Varying Annealing Conditions and Precursor Purities (Hg,Re)1223 superconductor materials were prepared in accordance with the procedure described in Example 2, except that the annealing temperature and annealing time were varied as reported in Table 1 in order to evaluate the performance characteristics of such materials. For each of the (Hg,Re)1223 samples prepared, the atomic ratio of mercury to rhenium was approximately 9:1. The results of these experiments are reported in Table 1.

TABLE 1

| Annealing Temp (°C.) | Annealing Temp (Hours) | $T_o$ (K) | AC signal amplitude (a.u.) | Weight (Mg) | Normalized Signal (per 100) |
|---|---|---|---|---|---|
| 725 | 48 | 133 | 5 | 155.9 | 3.20 |
| 750 | 48 | 133 | 5 | 195 | 2.56 |
| 775 | 48 | 133 | 50 | 177.8 | 28.1 |
| 800 | 48 | 133 | 19 | 149 | 12.7 |
| 825 | 48 | 132 | 25 | 60 | 41.7 |
| 850 | 48 | 132 | 100 | 145.5 | 68.7 |
| 750 | 8 | 133 | 16 | 152 | 10.5 |
| 800 | 8 | 133 | 51 | 162 | 33.6 |
| 850 | 8 | 133 | 49 | 142 | 34.5 |

The effects of the present invention are further illustrated in FIGS. 2 to 7. FIGS. 2 to 7 relate to the (Hg,Re)1223 superconductor samples reported in Table 1. The samples reported in these figures for specific annealing times and temperatures correspond to the samples reported in Table 1 for the same annealing times and temperatures.

Figure 5A:
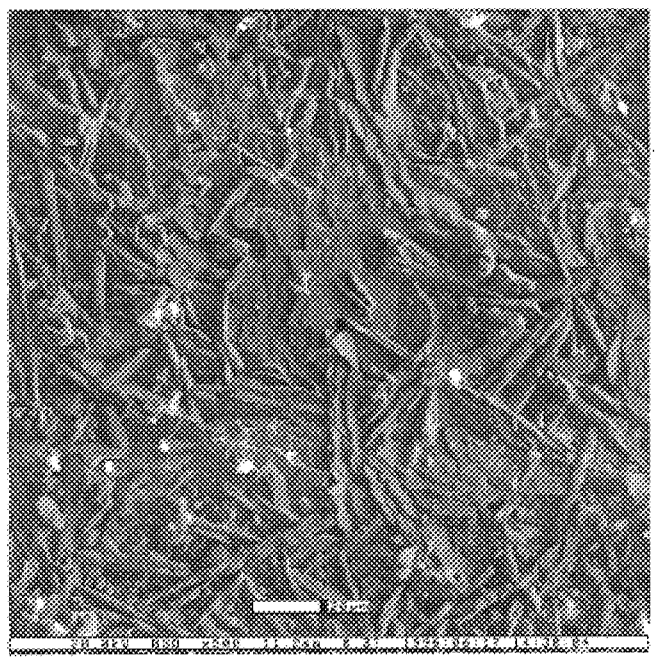
FIG. 5 shows the SEM surface images of $(Hg_{1-x}Re_x)Ba_2Ca_1Cu_2O_{6-y}$ samples prepared in accordance with the process using the following annealing times and temperatures: (a) 8 hours at 800° C.; and (b) 48 hours at 800° C.
Figure 5B:
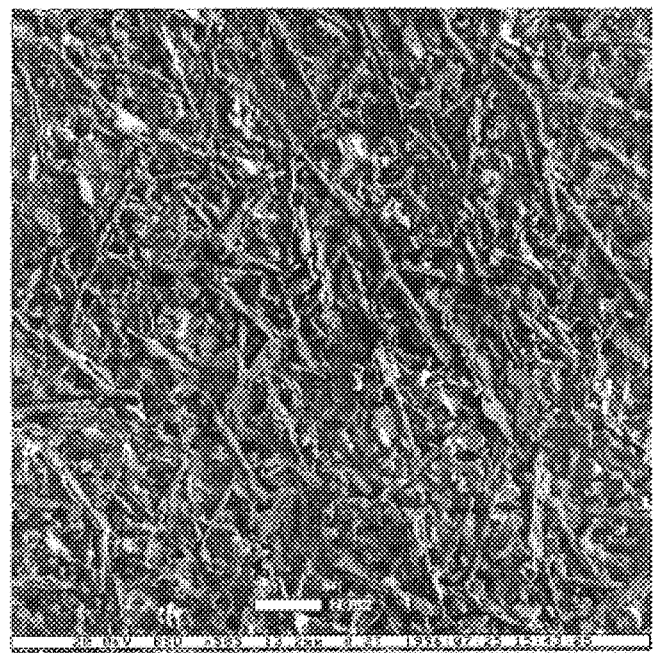
Figure 6:
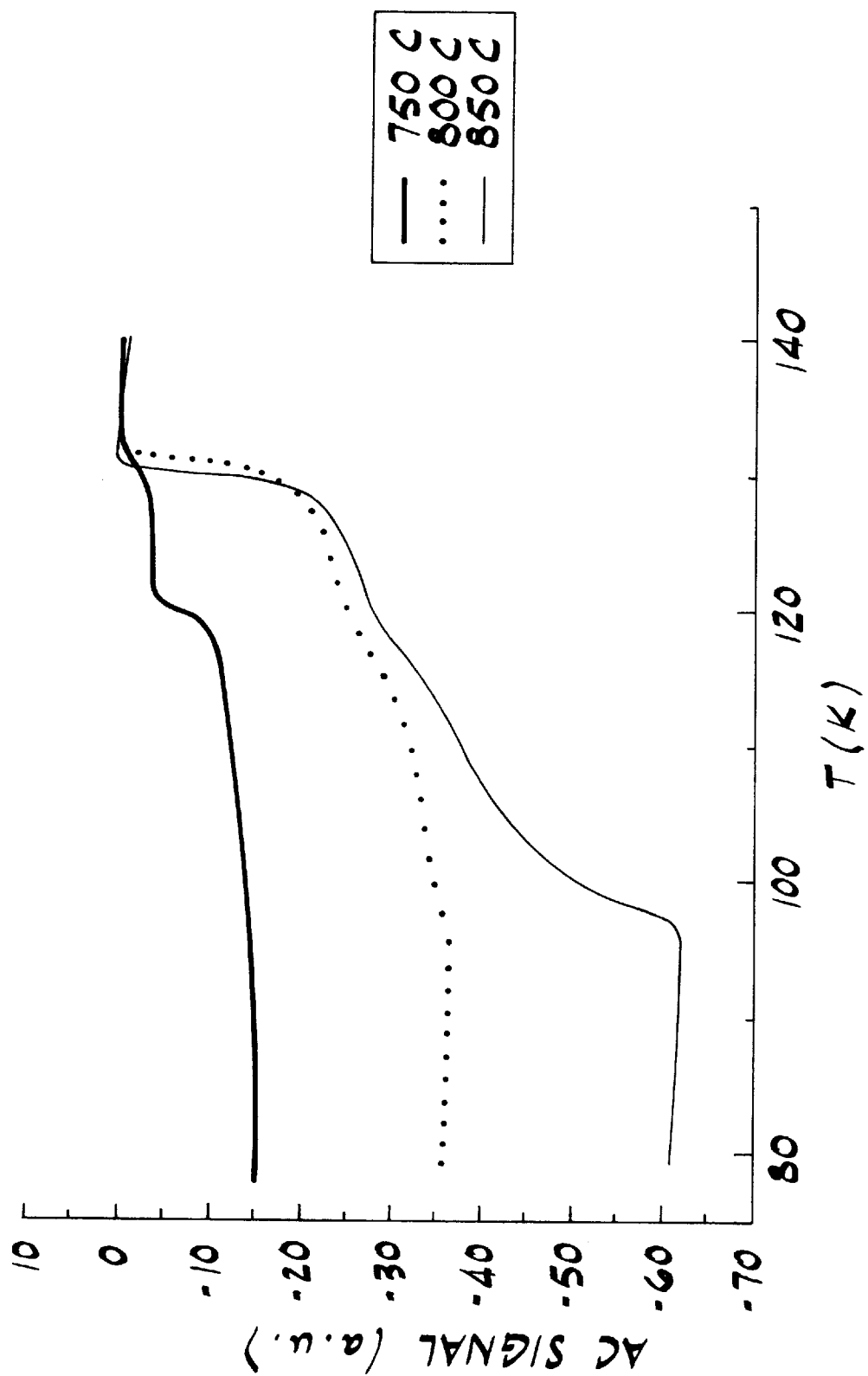
FIG. 6 illustrates the AC susceptibility of $(Hg_{1-x}Re_x)Ba_2Ca_2Cu_3O_{8-y}$ prepared in accordance with the process as a function of annealing temperature.
Figure 7:
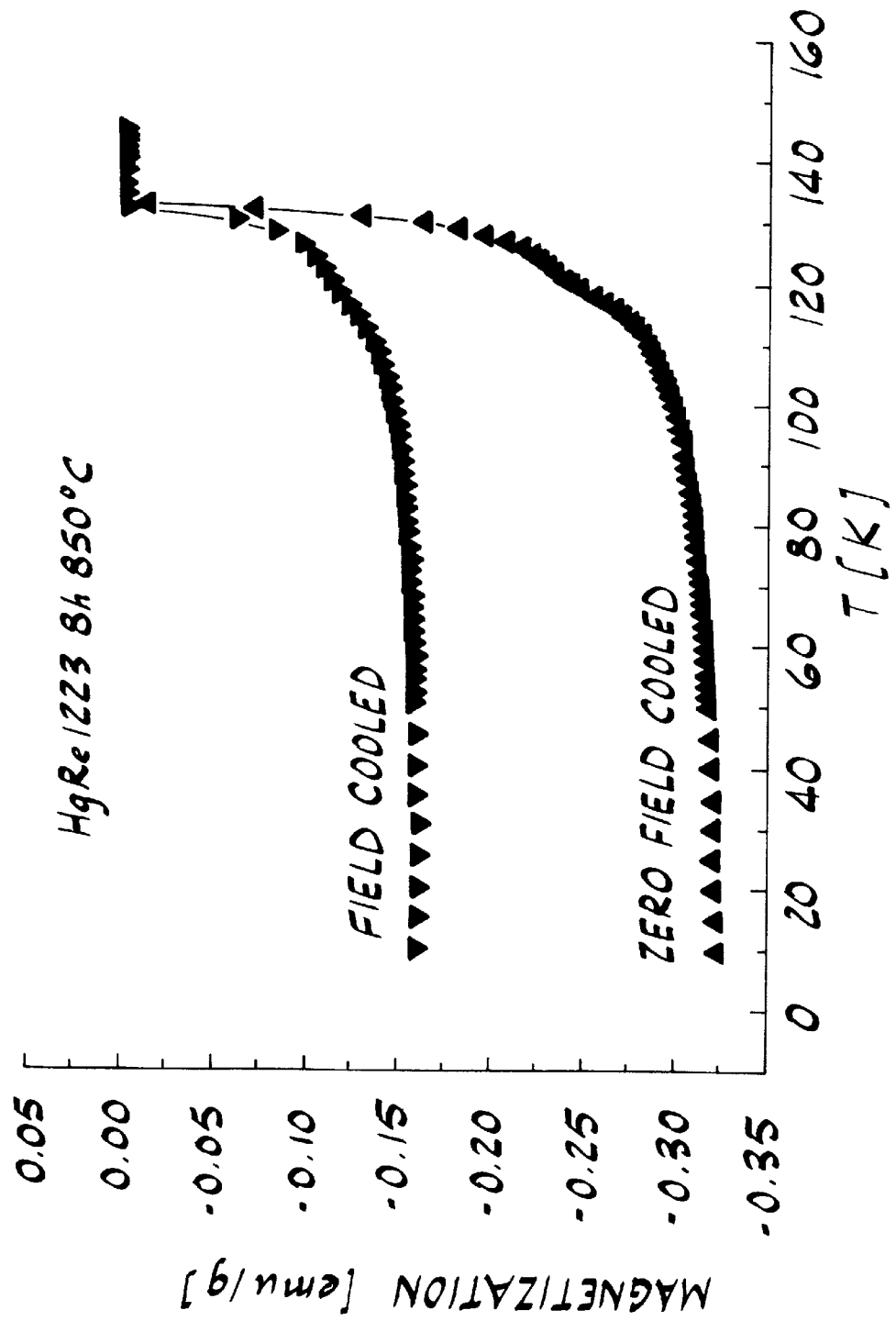
FIG. 7 illustrates the SQUID magnetization measurement of $(Hg_{1-x}Re_x)Ba_2Ca_2Cu_3O_{8-y}$ prepared in accordance with the process using an annealing temperature of 850° C. for 8 hours.
Figure 8A:
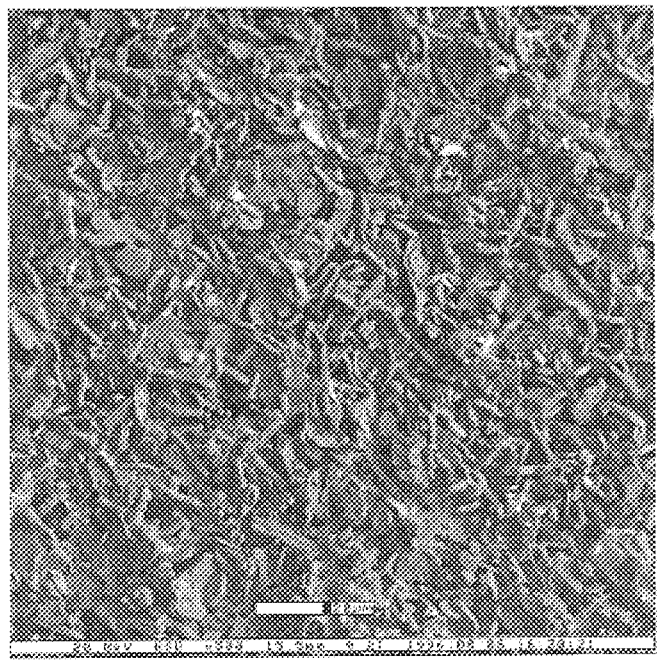
FIG. 8 shows the SEM surface images of $(Hg_{1-x}Re_x)Ba_2Ca_2Cu_3O_{8-y}$ samples prepared in the conventional encapsulation manner using the following annealing times and temperatures: (a) 8 hours at 750° C.; (b) 8 hours at 800° C.; (c) 8 hours at 850° C.; (d) 8 hours at 870° C.; (e) 8 hours at 900° C.
Figure 8B:
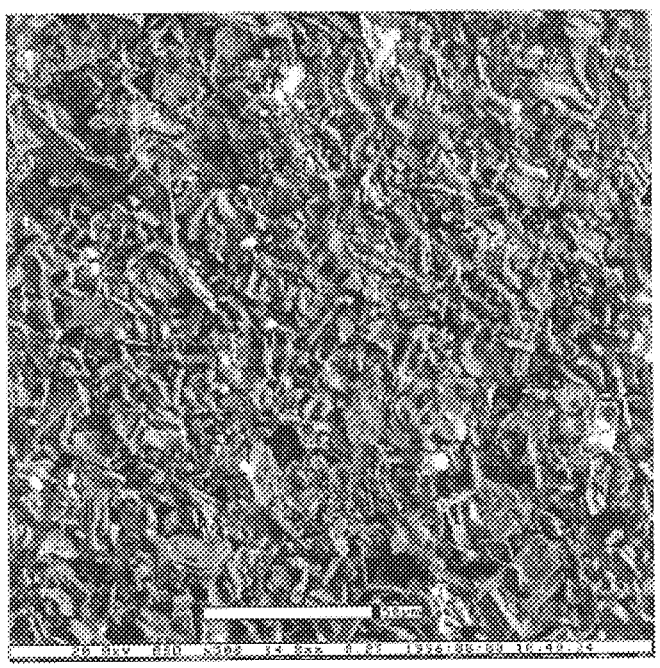
Figure 8C:
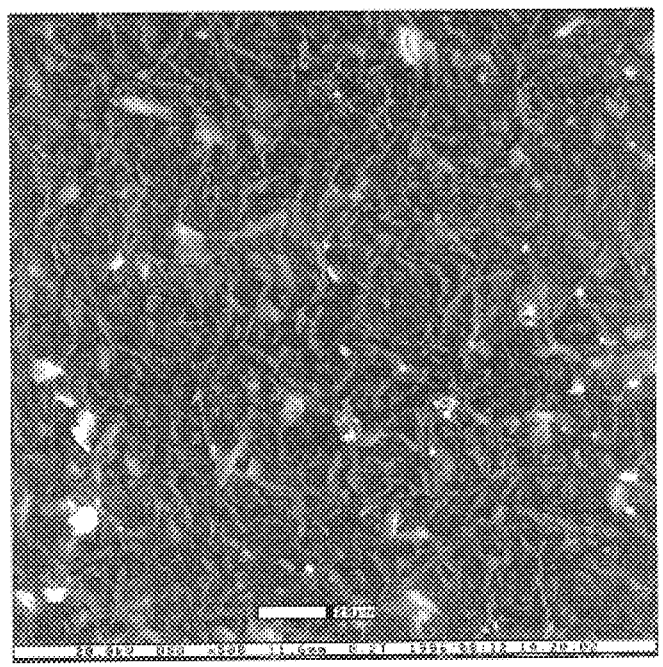
Figure 8D:
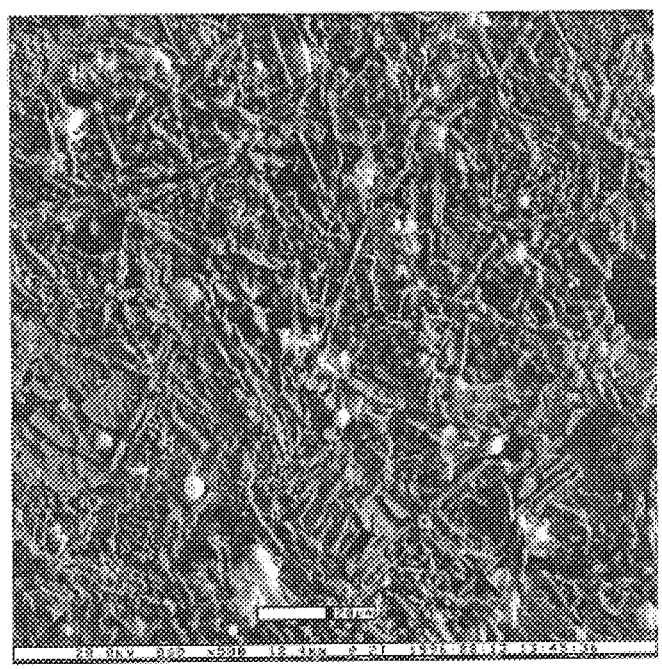
Figure 8E:
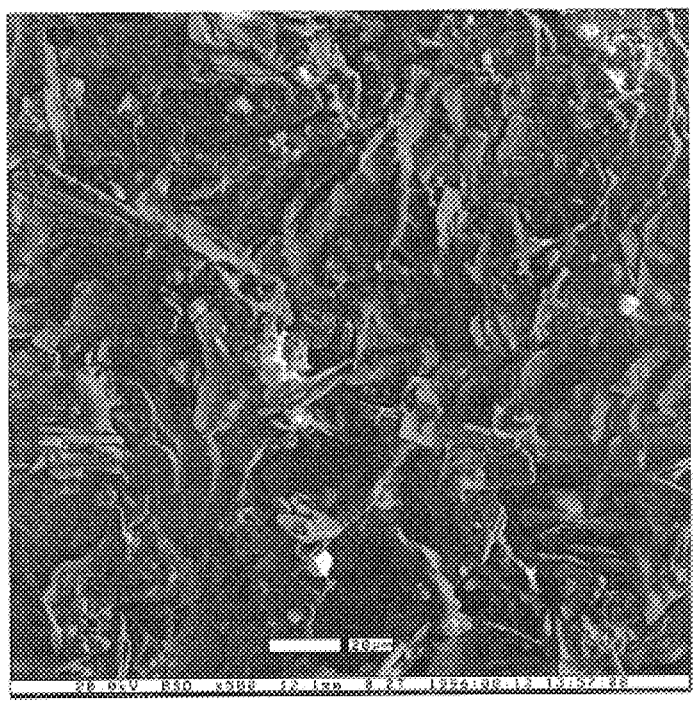

In FIG. 5, the steps around 130K indicate the presence of the (Hg,Re)1223 superconducting phase and the steps around 110K indicate the presence of the (Hg,Re)1212 superconducting phase. The samples have (Hg,Re)1223 as the majority phase and exhibit a critical temperature of 133K. The grain size depends upon annealing time and temperature and approach about 50 μm in diameter and about 5 μm thick.

The remaining figures, FIGS. 8 to 10, illustrate the SEM surface images, AC susceptibility measurements and SQUID magnetization measurements obtained for HgBaCaCuO superconductors prepared in accordance with conventional encapsulation methods at the reported annealing times and temperatures.

EXAMPLE 5

Preparation of Superconductor-Metal Composite Material $(Hg_{0.9}Re_{0.1})Ba_2Cu_1Cu_2O_{6-y}$ was prepared in accordance with the procedure set forth in Example 1 from multiphase $Ba_2CaCu_2O_5$ (Seattle Specialty Ceramics, 99.9% purity, 100 ppm C, 3 m particle size), $Re_2O_7$ (Alpha Aesar), HgO (Alpha Aesar), CaO and CuO. The $(Hg_{0.9}Re_{0.1})Ba_2Cu_1Cu_2O_{6-y}$ prepared was finely ground in an alumina mortar in an argon-atmosphere glove box. 25 mg of the resulting powder mixture was suspended in a dry methanol solution.

This powder mixture was then spin-coated in a centrifuge onto a piece of silver foil (ESPI 99.9%) approximately 5 mm by 10 mm and 100 µm thick to form a film having a thickness less than about 100 microns. The silver foil previously had been cleaned with acetone and dry methanol. The coated foil was dried in air (or alternatively in argon) and placed in an alumina sheath (50 mm in length, 6 mm I.D., 7 mm O.D.). About 0.5 gram of pressed pellets prepared in accordance with the process set forth in Example 2 was also placed in the alumina sheath to help establish the necessary mercury vapor pressure.

The alumina sheaths were then inserted into a thick walled quartz tube (100 mm in length, 8 mm I.D., 12 mm O.D. followed by a quartz rod (50 mm in length, 7 mm O.D.) to reduce the open volume. The tube was evacuated to about 150 mTorr and sealed with a hydrogen torch. The encapsulated samples were then annealed for 48 hours at a temperature of about 775° C.

Samples also were prepared on AgHg foil (made in-house from mercurated ESPI 99.9% silver foil), gold foil (Alpha Aesar, 99.9% purity), and platinum foil (ESPI, 99.9% purity) as provided above except that the AgHg foil sample was annealed at a temperature of about 785° C. and the gold foil and platinum foil samples were each annealed at a temperature of about 850° C.

The lower annealing temperatures relative to those employed in conventional processes allowed for the use of lower melting substrate or sheathing materials. In addition, the lower annealing temperatures eliminated or reduced the required diffusion barriers or buffer materials needed to prevent corrosion or amalgam formation from occurring between the superconductor material and the substrate or sheathing.

In view of the above, it will be seen that the several objects of the invention are achieved and other advantageous results attained.

Although specific examples of the present invention and its application are set forth, it is not intended that they be exhaustive or limiting of the invention. These illustrations and explanations are intended to acquaint others skilled in the art with the invention, its principles, and its practical application, so that others skilled in the art may adapt and apply the invention in its numerous forms, as may be best suited to the requirements of a particular use. As various changes could be made in the above methods and compositions without departing from the scope of the invention, it is intended that all matter contained in the above description shall be interpreted as illustrative and not in a limiting sense.

What is claimed is:

1. A process for preparing a superconductor, the process comprising the steps of:
   mixing a doped or undoped first member of a series of superconductors comprising mercury, barium, copper and oxygen; a source of calcium; and a source of copper to form a precursor mixture; and
   annealing the precursor mixture to form a second member of the series of superconductors comprising mercury, barium, copper and oxygen;
   said source of calcium and said source of copper being provided so as to maintain the approximate stoichiometry of the second member of the series of superconductors prepared from the precursor mixture; and
   said second member having a larger atomic ratio of calcium to barium than said first member.

2. The process of claim 1 wherein the precursor mixture comprises a source of oxygen, said source of oxygen supplementing the oxygen contributed to the precursor mixture by the first member.

3. The process of claim 1 wherein the precursor mixture comprises a source of rhenium.

4. The process of claim 3 wherein the precursor mixture comprises a source of an element selected from the group consisting of halogens and metals other than mercury, barium, calcium, copper and rhenium.

5. The process of claim 4 wherein the element is selected from the group consisting of lithium, strontium, thallium, vanadium, chromium, tungsten, platinum, gold and silver.

6. The process of claim 4 wherein the element is selected from the group consisting of lithium, strontium and thallium.

7. The process of claim 4 wherein the element is lithium.

8. The process of claim 1 wherein the precursor mixture is pressed prior to being annealed.

9. The process of claim 1 wherein the precursor mixture comprises at least about 50% by weight of the first member.

10. The process of claim 1 wherein the precursor mixture comprises at least about 60% by weight of the first member.

11. The process of claim 1 wherein the precursor mixture comprises at least about 70% by weight of the first member.

12. The process of claim 1 wherein the precursor mixture comprises at least about 80% by weight of the first member.

13. The process of claim 1 wherein the precursor mixture is annealed at a temperature less than about 850° C.

14. The process of claim 1 wherein the precursor mixture is annealed at a temperature less than about 825° C.

15. The process of claim 1 wherein the precursor mixture is annealed at a temperature less than about 800° C.

16. The process of claim 1 wherein the precursor mixture is annealed at a temperature less than about 775° C.

17. The process of claim 1 wherein the precursor mixture is annealed for less than about 100 hours.

18. The process of claim 1 wherein the precursor mixture is annealed for less than about 48 hours.

19. The process of claim 1 wherein the precursor mixture is annealed for less than about 32 hours.

20. The process of claim 1 wherein the precursor mixture is annealed for less than about 24 hours.

21. The process of claim 1 wherein the precursor mixture is annealed for less than about 16 hours.

22. The process of claim 1 wherein the precursor mixture is annealed at a temperature of less than about 850° C. for less than about 16 hours.

23. The process of claim 1 wherein the precursor mixture is annealed at a temperature of less than about 825° C. for less than about 24 hours.

24. The process of claim 1 wherein the precursor mixture is annealed at a temperature of less than about 800° C. for less than about 32 hours.

25. The process of claim 1 wherein the precursor mixture is annealed at a temperature of less than about 775° C. for less than about 48 hours.

26. The process of claim 1 wherein the precursor mixture is contacted with a substrate prior to the annealing step.

27. The process of claim 26 wherein the substrate is selected from the group consisting of silver, gold, platinum, and alloys of silver and mercury.

28. The process of claim 26 wherein the substrate is selected from the group consisting of silver and alloys of silver and mercury.

29. The process of claim 1 wherein the first member and second member are selected from the group consisting of undoped Hg1201, Hg1212, Hg1223 and Hg1234 superconductors.

30. The process of claim 1 wherein the first member and second member are selected from the group consisting of doped Hg1201, Hg1212, Hg1223 and Hg1234 superconductors.

31. The process of claim 1 wherein the precursor mixture comprises a source of rhenium.

32. The process of claim 1 wherein the first member is undoped Hg1212 or Hg1212 doped with rhenium, the second member is Hg1223 doped with rhenium, the precursor mixture comprises at least about 50% by weight of the first member, and the precursor mixture is annealed at a temperature less than about 850° C. for less than about 24 hours.

33. The process of claim 1 wherein the source of calcium is selected from the group consisting of elemental calcium, calcium oxides, calcium carbonates and calcium nitrides, and the source of copper is selected from the group consisting of elemental copper, copper oxides, copper carbonates and copper nitrides.

34. The process of claim 1 wherein the source of calcium is selected from the group consisting elemental calcium and calcium oxides, and the source of copper is selected from the group consisting of elemental copper and copper oxides.

35. A process for preparing a superconductor, said process comprising the steps of:
    mixing a first member of a series of superconductors comprising mercury, barium, copper and oxygen; a source of calcium; a source of copper; and a source of rhenium to form a precursor mixture; the atomic ratio of mercury to rhenium in the precursor mixture being greater than about 3:1; and
    annealing the precursor mixture to form a second member of the series of superconductors comprising mercury, barium, copper and oxygen;
    said source of calcium and said source of copper being provided so as to maintain the approximate stoichiometry of the second member of the series of superconductors prepared from the precursor mixture; and
    said second member having a larger atomic ratio of calcium to barium than said first member.

36. The process of claim 35 wherein the precursor mixture comprises a source of oxygen, said source of oxygen supplementing the oxygen contributed to the precursor mixture by the first member.

37. The process of claim 35 wherein the atomic ratio of mercury plus rhenium to barium to calcium to copper in the second member is approximately 1:2:2:3, and the precursor mixture is pressed prior to being annealed.

38. The process of claim 37 wherein the precursor mixture comprises at least about 50% by weight of the first member, and the precursor mixture is annealed at a temperature of less than about 850° C. for less than about 48 hours.

39. The process of claim 38 wherein the unpressed precursor mixture has an average particle size which is less than about 100 $\mu$m, and the average density of the pressed precursor mixture prior to annealing is at least about 1.4 times the average density of the unpressed precursor mixture.

40. The process of claim 35 wherein the precursor mixture is contacted with a substrate prior to the annealing step.

41. The process of claim 40 wherein the substrate is selected from the group consisting of silver, gold, platinum, and alloys of silver and mercury.

42. The process of claim 40 wherein the substrate is selected from the group consisting of silver and alloys of silver and mercury.

43. The process of claim 35 wherein the first member is prepared by a process comprising the following steps:
    mixing a source of mercury, a source of barium, a source of calcium, a source of copper, a source of oxygen and a source of rhenium to form a preliminary precursor mixture;
    pressing the preliminary precursor mixture; and
    annealing the pressed preliminary precursor mixture to form the first member.

44. A process for preparing a superconductor having the formula $(Hg_{1-(x+z)},Re_x,D_z)Ba_2Ca_2Cu_3O_{8-y}$, wherein Re is rhenium; D is an element selected from the group consisting of halogens and metals other than mercury, barium, calcium, copper and rhenium; x ranges from 0 to about 0.25; z ranges from 0 to about 0.25; and y is a rational number between about negative 1 to about positive 1, said process comprising the steps of:
    mixing a first member of a series of superconductors comprising mercury, barium, copper and oxygen; a source of calcium; and a source of copper to form a precursor mixture; and
    annealing the precursor mixture to form a second member of the series of superconductors comprising mercury, barium, copper and oxygen;
    wherein the first member has the formula $(Hg_{1-(x+z)},Re_x,D_z)Ba_2Ca_1Cu_2O_{6-y}$; Re is rhenium; D is an element selected from the group consisting of halogens and metals other than mercury, barium, calcium, copper and rhenium; x ranges from 0 to about 0.25; z ranges from 0 to about 0.25; and y is a rational number between about negative 1 to about positive 1;
    said source of calcium and said source of copper being provided so as to maintain the approximate stoichiometry of the second member of the series of superconductors prepared from the precursor mixture; and
    said second member having a larger atomic ratio of calcium to barium than said first member.

45. The process of claim 44 wherein D is selected from the group consisting of lithium, strontium, thallium, vanadium, chromium, tungsten, platinum, gold and silver.

46. The process of claim 44 wherein D is selected from the group consisting of lithium, strontium and thallium.

47. The process of claim 44 wherein D is lithium.

* * * * *